(12) United States Patent
Luo

(10) Patent No.: US 10,566,901 B2
(45) Date of Patent: Feb. 18, 2020

(54) CONSTANT-FREQUENCY CONTROL METHOD WITH FAST TRANSIENT

(71) Applicant: Monolithic Power Systems, Inc., San Jose, CA (US)

(72) Inventor: Zheng Luo, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 16/016,479

(22) Filed: Jun. 22, 2018

(65) Prior Publication Data
US 2019/0393783 A1    Dec. 26, 2019

(51) Int. Cl.
| H02M 3/157 | (2006.01) |
| H03K 4/50 | (2006.01) |
| H03F 3/45 | (2006.01) |
| H02M 1/08 | (2006.01) |
| H02M 3/15 | (2006.01) |
| H02M 1/00 | (2006.01) |
| H03K 19/20 | (2006.01) |
| H03K 5/24 | (2006.01) |
| H02M 3/156 | (2006.01) |
| H02M 3/158 | (2006.01) |
| H02M 1/14 | (2006.01) |

(52) U.S. Cl.
CPC ............. *H02M 3/157* (2013.01); *H02M 1/08* (2013.01); *H02M 3/15* (2013.01); *H03F 3/45071* (2013.01); *H03K 4/50* (2013.01); H02M 1/14 (2013.01); H02M 3/156 (2013.01); H02M 3/1588 (2013.01); H02M 2001/0025 (2013.01); H03F 2200/48 (2013.01); H03F 2203/45631 (2013.01); H03K 5/24 (2013.01); H03K 19/20 (2013.01)

(58) Field of Classification Search
CPC .......... H02M 1/15; H02M 1/14; H02M 3/157; H02M 3/156; H02M 3/158; H02M 3/1588
See application file for complete search history.

(56) References Cited

U.S. PATENT DOCUMENTS

| 9,923,463 | B2 | 3/2018 | Yuan et al. | |
| 2010/0264895 | A1* | 10/2010 | Weng .................. | H02M 3/1588 323/285 |
| 2012/0146606 | A1* | 6/2012 | Li ......................... | H02M 3/156 323/283 |
| 2015/0188433 | A1* | 7/2015 | Jiang ..................... | H02M 3/158 323/271 |
| 2015/0244262 | A1* | 8/2015 | Ouyang ................ | H02M 3/158 323/283 |
| 2017/0070148 | A1* | 3/2017 | Yuan ..................... | H02M 3/158 |

\* cited by examiner

*Primary Examiner* — Kyle J Moody
(74) *Attorney, Agent, or Firm* — Perkins Coie LLP

(57) ABSTRACT

A control circuit and method for a voltage converter. The control circuit having a ramp circuit, a reference generating circuit, a comparison circuit and a logic circuit. The ramp circuit generates a ramp signal that decreases from the moment the power switch is turned off and increases from the moment the power switch is turned on. The reference generating circuit generates a reference voltage. The comparison circuit compares the reference voltage with the sum of the feedback voltage and the ramp signal to generate a comparison signal. The logic circuit uses the comparison signal and a clock signal to generate the control signal to control a power switch of the voltage converter.

13 Claims, 7 Drawing Sheets

CONSTANT-FREQUENCY CONTROL METHOD WITH FAST TRANSIENT

TECHNICAL FIELD

The present invention generally relates to electrical circuits, and more particularly but not exclusively relates to voltage converters.

BACKGROUND

COT (Constant On-Time) control has been widely used with DC/DC voltage converters for its fast transient response. However, the switching frequency of the COT controlled voltage converter is variable and not constant, which makes COT control hardly applied in cases where a constant switching frequency is essentially required, such as an automobile system. Contrarily, peak current mode control has a constant switching frequency, but it is slow in transient response, and the minimum on time of a power switch during each switching cycle is required to implement current sensing function.

Consequently, a control circuit and scheme thereof with fast transient response and constant switching frequency is needed.

SUMMARY

There has been provided, in accordance with an embodiment of the present invention, a control circuit for a voltage converter converting an input voltage into an output voltage, wherein the voltage converter has a power switch, the control circuit comprising: a ramp circuit, configured to generate a ramp signal, wherein the ramp signal decreases from the moment the power switch is turned off and increases from the moment the power switch is turned on; a reference generating circuit, configured to generate a reference voltage, wherein the reference voltage increases from the value of a base voltage when the power switch is turned off; a comparison circuit, configured to provide a comparison signal in response to the reference voltage and the sum of the feedback voltage and the ramp signal; and a logic circuit, configured to generate a control signal to control the power switch based on the comparison signal and a clock signal, wherein the power switch is turned off by the clock signal, and is turned on when the comparison signal indicates that the reference voltage increases to the sum of the feedback voltage and the ramp signal.

There has been provided, in accordance with an embodiment of the present invention, a voltage converting system for converting an input voltage into an output voltage, comprising: a voltage converter, comprising a power switch having a first terminal coupled to the input voltage, a second terminal and a controlled terminal; and a control circuit, comprising: a ramp circuit, configured to generate a ramp signal, wherein the ramp signal decreases from the moment the power switch is turned off and increases from the moment the power switch is turned on; a reference generating circuit, configured to generate a reference voltage, wherein the reference voltage increases from the value of a base voltage from the moment the power switch is turned off; a comparison circuit, configured to provide a comparison signal in response to the reference voltage and the sum of the feedback voltage and the ramp signal; and a logic circuit, configured to generate the control signal based on the comparison signal and a clock signal, wherein the power switch is turned off by the clock signal, and is turned on when the comparison signal indicates that the reference voltage increases to the sum of the feedback voltage and the ramp signal.

There has been provided, in accordance with an embodiment of the present invention, turning off the power switch by a clock signal with constant frequency; generating a ramp signal and a reference voltage, wherein the ramp signal decreases from the moment the power switch is turned off and increases from the moment the power switch is turned on, and the reference voltage increases from the value of a base voltage from the moment the power switch is turned off; comparing the reference voltage with the sum of a feedback voltage and the ramp signal, wherein the feedback voltage is in proportion to the output voltage; and turning on the power switch when the reference voltage reaches the sum of the feedback voltage and the ramp signal.

BRIEF DESCRIPTION OF THE DRAWINGS

The present invention can be further understood with reference to the following detailed description and the appended drawings, wherein like elements are provided with like reference numerals. The drawings are only for illustration purpose. They may only show part of the devices and are not necessarily drawn to scale.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
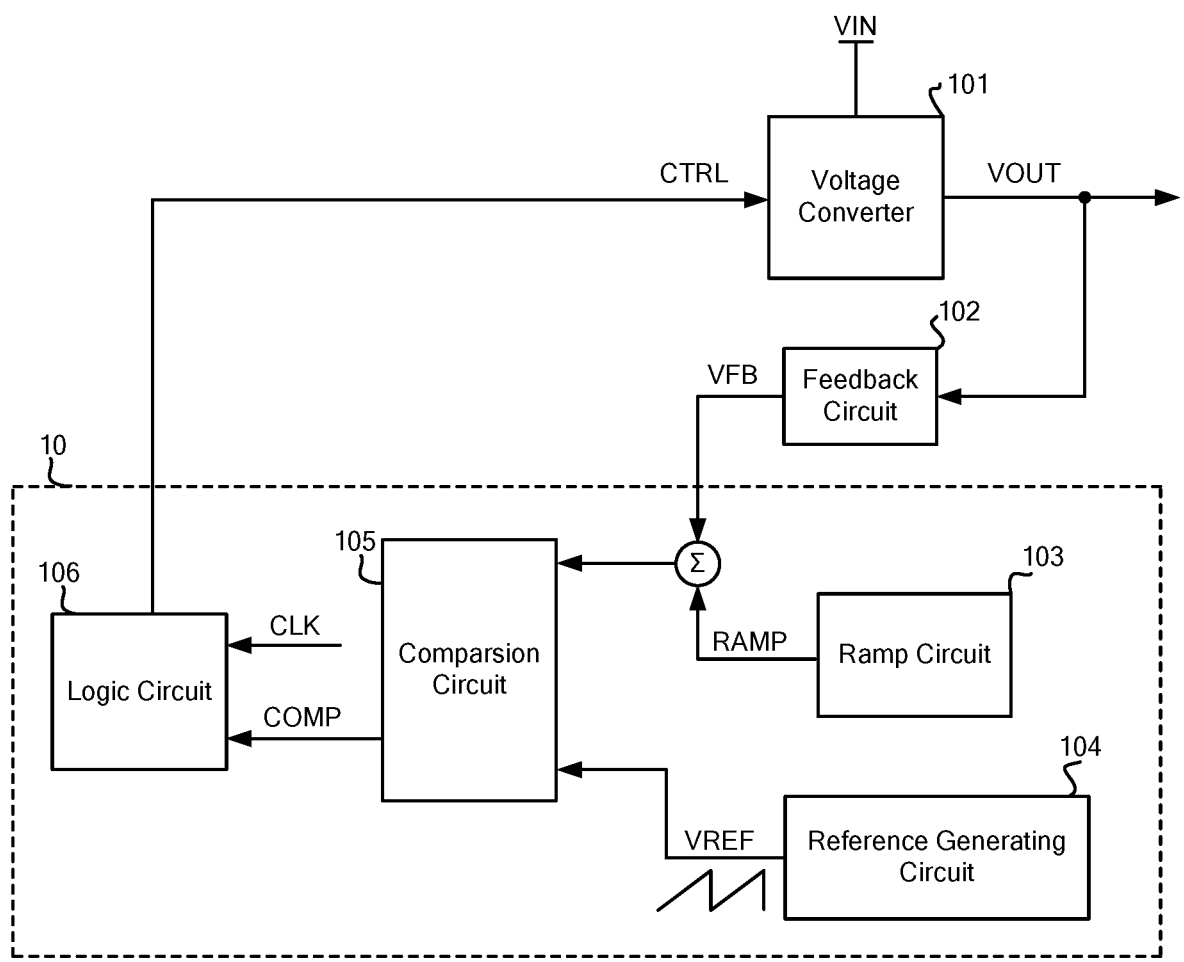
FIG. 1 illustrates a block diagram of a control circuit 10 for a voltage converter 101 in accordance with an embodiment of the present invention.

FIG. 1 illustrates a block diagram of a control circuit 10 for a voltage converter 101 in accordance with an embodiment of the present invention. The voltage converter 101 comprises at least a power switch, and is configured to receive an input voltage VIN and to provide an output voltage VOUT. A feedback circuit 102 receives the output voltage VOUT and provides a feedback voltage VFB in proportion to the output voltage VOUT. In the example of FIG. 1, the control circuit 10 comprises a ramp circuit 103, a reference generating circuit 104, a comparison circuit 105, and a logic circuit 106. The ramp circuit 103 is configured to provide a ramp signal RAMP. The reference generating circuit 104 is configured to provide a reference voltage VREF increasing with a slew rate and falling down at a certain moment periodically. The ramp signal is added to the feedback voltage VFB, and the sum is provided to the comparison circuit 105. The comparison circuit 105 receives the reference signal VREF and the sum of the feedback voltage VFB and the ramp signal RAMP, and provides a comparison signal COMP based thereon. The logic circuit 106 is coupled to the comparison circuit 105 to receive the comparison signal COMP and a clock signal CLK with constant frequency, and to provide a control signal CTRL to control the voltage converter 101.

The constant frequency clock signal CLK may be generated by an internal clock circuit integrated with the control circuit 10, or may be generated by a discrete clock generator.

Figure 2:
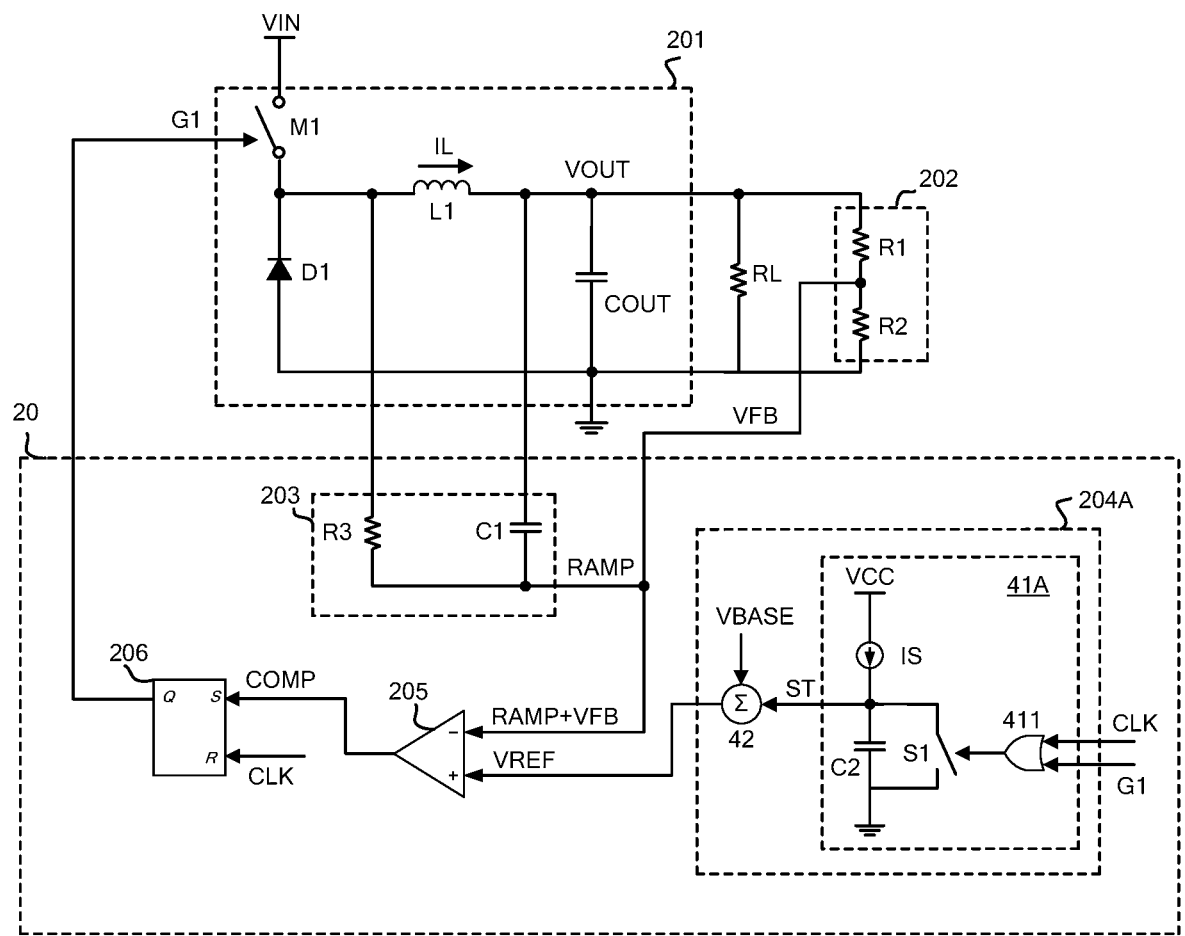
FIG. 2 schematically shows a control circuit 20 in accordance with an embodiment of the present invention.

FIG. 2 schematically shows a control circuit 20 in accordance with an embodiment of the present invention. The control circuit 20 comprises a ramp circuit 203, a reference generating circuit 204A, a comparison circuit 205 and a logic circuit 206.

The control circuit 20 is configured to control a voltage converter 201 receiving the input voltage VIN and providing the output voltage VOUT. The voltage converter 201 comprises a high-side power switch M1, a low-side diode D1, an inductor L1 and an output capacitor COUT. The high-side power switch M1 has a first terminal coupled to the input voltage VIN, a second terminal and a control terminal. The low-side diode D1 has a cathode terminal coupled to the second terminal of the high-side power switch M1, an anode terminal coupled to a ground reference. The inductor L1 has a first terminal coupled to the second terminal of the high-side power switch M1, and a second terminal. The output capacitor COUT has a first terminal coupled to the second terminal of the inductor L1, and a second terminal coupled to the ground reference. The voltage across the output capacitor COUT is provided as the output voltage VOUT.

A feedback circuit 202 receives the output voltage VOUT and provides the feedback voltage VFB in proportion to the output voltage VOUT. In the example of FIG. 2, the feedback circuit 202 comprises a resistor network of resistors R1 and R2.

The ramp circuit 203 provides the ramp signal RAMP. The ramp circuit comprises a network of a resistor R3 and a capacitor C1. The ramp signal RAMP, generated at the connection node of the resistor R3 and the capacitor C1, is in-phase with the inductor current IL flowing through the inductor L1. It should be noted that, the ramp circuit 203 is directed to emulate the inductor current IL, which means that the ramp signal RAMP increases when the inductor current IL increases and decreases when the inductor current IL decreases. This relieves the burden of sensing or detecting the inductor current IL, so that a very small value of the minimum of on-time for the high-side power switch M1 may be achieved.

The reference generating circuit 204A receives the clock signal CLK and the control signal G1, and provides the reference voltage VREF. The reference generating circuit 204A comprises a sawtooth circuit 41A and an adding circuit 42. The sawtooth circuit 41A comprises a current source IS, a capacitor C2, a switch S1, an OR gate 411. The current source IS has a first terminal coupled to an internal power supply voltage VCC and a second terminal configured to provide a charge current to the capacitor C2. The capacitor C2 has a first terminal coupled to the second terminal of the current source IS, and a second terminal coupled to the ground reference. The OR gate 411 has a first input terminal receiving the clock signal CLK, a second input terminal receiving the control signal G1, and an output terminal providing a signal to control the switch S1. The switch S1 is paralleled with the capacitor C2, and is controlled to be on and off by the signal provided by the OR gate 411. The adding circuit 42 has a first input terminal receiving the voltage across the capacitor C2, i.e. a sawtooth signal ST, a second input terminal receiving a base voltage VBASE, and an output terminal providing the reference voltage VREF, i.e. the sum of the base voltage VBASE and the sawtooth signal ST.

The comparison circuit 205 receives the sum of the feedback voltage VFB and the ramp signal RAMP, and the reference voltage VREF, and provides the comparison signal COMP. In the example of FIG. 2, the comparison circuit 205 comprises a comparator. The comparator has an inverting input terminal receiving the sum of the feedback voltage VFB and the ramp signal RAMP, a non-inverting input terminal receiving the reference voltage VREF, and an output terminal providing the comparison signal COMP. The comparison signal COMP stays at low level until the reference voltage VREF increases to the sum of the feedback voltage VFB and the ramp signal RAMP.

The logic circuit 206 receives the comparison signal COMP and the clock signal CLK, and provides a control signal G1. The logic circuit comprises a RS latch. The RS latch has a reset terminal "R" receiving the clock signal CLK, a set terminal "S" receiving the comparison signal COMP, an output terminal providing the control signal G1 to control the high-side power switch M1.

In the example of FIG. 2, the sawtooth signal ST is generated at the first terminal of the capacitor C2. In a clock cycle, when the clock signal CLK pulses, e.g. at the rising edge of the clock signal, the control signal G1 is reset and the high side-power switch M1 is turned off. The output of the OR gate 411 accordingly rises to high level, and the switch S1 is turned on. As a result, the capacitor C2 is discharged. When the pulse of the clock signal CLK, which is narrow and indicates a small duty cycle of the clock signal, is over, the clock signal CLK falls back to low level and so does the output of the OR gate, the switch S1 is then turned off, meaning that the capacitor is charged and the voltage across the capacitor C2, namely the sawtooth signal ST increases with a slew rate. Therefore the reference voltage VREF increases from the value of the base voltage VBASE, meanwhile the sum of the feedback voltage VFB and the ramp signal RAMP decreases since the high-side power switch M1 has been turned off and the ramp signal RAMP decreases. When the reference voltage VREF reaches the sum of the feedback voltage VFB and the ramp signal RAMP, the comparison signal COMP rises to high level, so the control signal G1 is set and the power switch M1 is turned on. The output of the OR gate 411 rises to high level and the switch S1 is turned on, the increasing sawtooth signal ST then decreases to the value of the base voltage VBASE. When the clock signal CLK begins the next clock cycle, the aforementioned operating process repeats.

In the example of FIG. 2, the power switch M1 is turned off by the rising edge of the clock signal CLK. In another embodiment, the power switch M1 is turned off by the falling edge of the clock signal CLK.

In the example of FIG. 2, the rising edge of the comparison signal COMP indicates that the reference voltage VREF reaches the sum of the feedback voltage VFB and the ramp signal RAMP, so as to set the control signal G1. In other embodiments, the falling edge of the comparison signal COMP indicates that the reference voltage VREF reaches the sum of the feedback voltage VFB and the ramp signal RAMP. As long as the power switch M1 is turned off by the clock signal CLK, and is turned on when the comparison signal COMP indicates the reference voltage reaches the sum of the feedback voltage VFB and the ramp signal RAMP, the spirit or the substance of the invention is not distracted.

The reference voltage VREF does not necessarily decreases when the reference voltage VREF reaches the sum of the feedback voltage VFB and the ramp signal RAMP, i.e. the moment the high-side power switch M1 is turned on. In an embodiment, the switch S1 is controlled by the clock signal CLK directly, wherein, when the clock signal CLK pulses in a clock cycle, the switch S1 is turned on and the increasing reference voltage VREF decreases to the value of the base voltage VBASE, then the reference voltage VREF increases until the clock signal CLK pulses in the next clock cycle.

Figure 3:
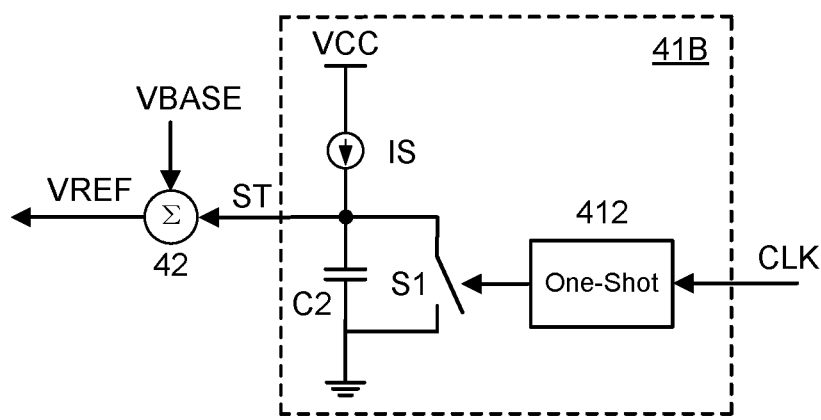
FIG. 3 shows a reference generating circuit 204B in accordance with another embodiment of the present invention.

FIG. 3 shows a reference generating circuit 204B in accordance with another embodiment of the present invention. The reference generating circuit 204B comprises a sawtooth circuit 41B and the adding circuit 42. The sawtooth circuit 41B comprises the current source IS, the capacitor C2, the switch S1, and a one-shot circuit 412. The one-shot circuit 412 has an input terminal receiving the clock signal CLK, and an output terminal providing a narrow pulse based on the rising edge of the clock signal CLK. The switch S1 is controlled to be on and off by the pulse provided by the one-shoot circuit 412. The clock signal CLK may be a square wave with 50% duty cycle. In another embodiment, the one-shot circuit 412 may provide a narrow pulse based on the falling edge of the clock signal CLK.

In an embodiment of the present invention, the low-side diode D1 may be replaced with a power switch.

In some embodiments of the present invention, the clock signal CLK may be generated by an internal clock circuit integrated with the voltage converter 201. In other embodiments, the clock signal CLK may be generated by a discrete clock generator.

Figure 4:
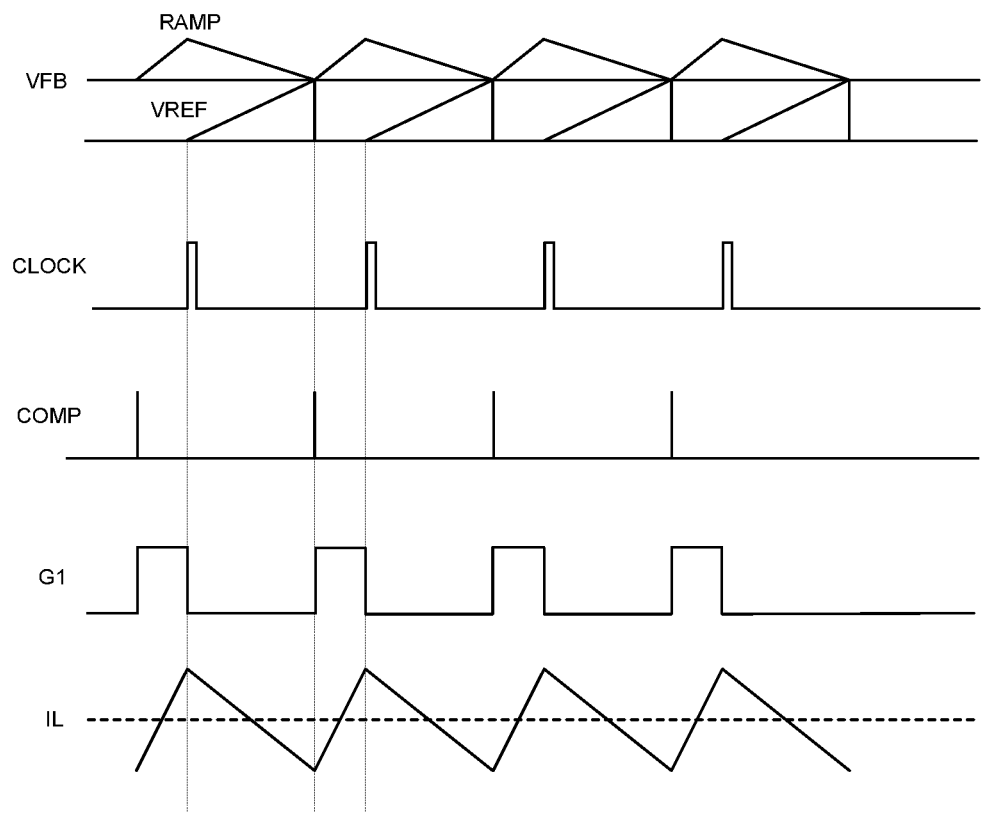
FIG. 4 shows the waveforms of the signals in FIG. 2 under steady state.

FIG. 4 shows the waveforms of the signals in FIG. 2 under steady state. As illustrated in FIG. 4, when the clock signal CLK pulses in a clock cycle, the control signal G1 is reset and falls to low level. Accordingly, the high-side power switch M1 is turned off and the low-side diode D1 turns on, meanwhile the inductor current IL decreases. The ramp signal RAMP begins to decrease gradually, while the reference voltage VREF increases gradually from the value of the base voltage VBASE. So, when the reference voltage VREF reaches the sum of the feedback voltage VFB and the ramp signal RAMP, the comparison signal COMP rises to high level from low level. The control signal G1 then rises to high level, the high-side power switch M1 is turned on, and the inductor current IL increases. The ramp signal RAMP begins to increase again, while the reference voltage VREF decreases. When the clock signal CLK pulses in the next clock cycle the signals change in the same way as in the last clock cycle.

The ramp signal RAMP is designed to emulate the inductor current IL, so there would be no need to sense the inductor current, and a very small minimum of on time is achieved. Meanwhile, the reference voltage VREF is designed to avoid that a possible perturbation grows larger and larger by each cycle and a sub-harmonic oscillation is then caused. Thus, the control circuit 20 is stable in operation and sub-harmonic oscillation is avoided.

Figure 5A:
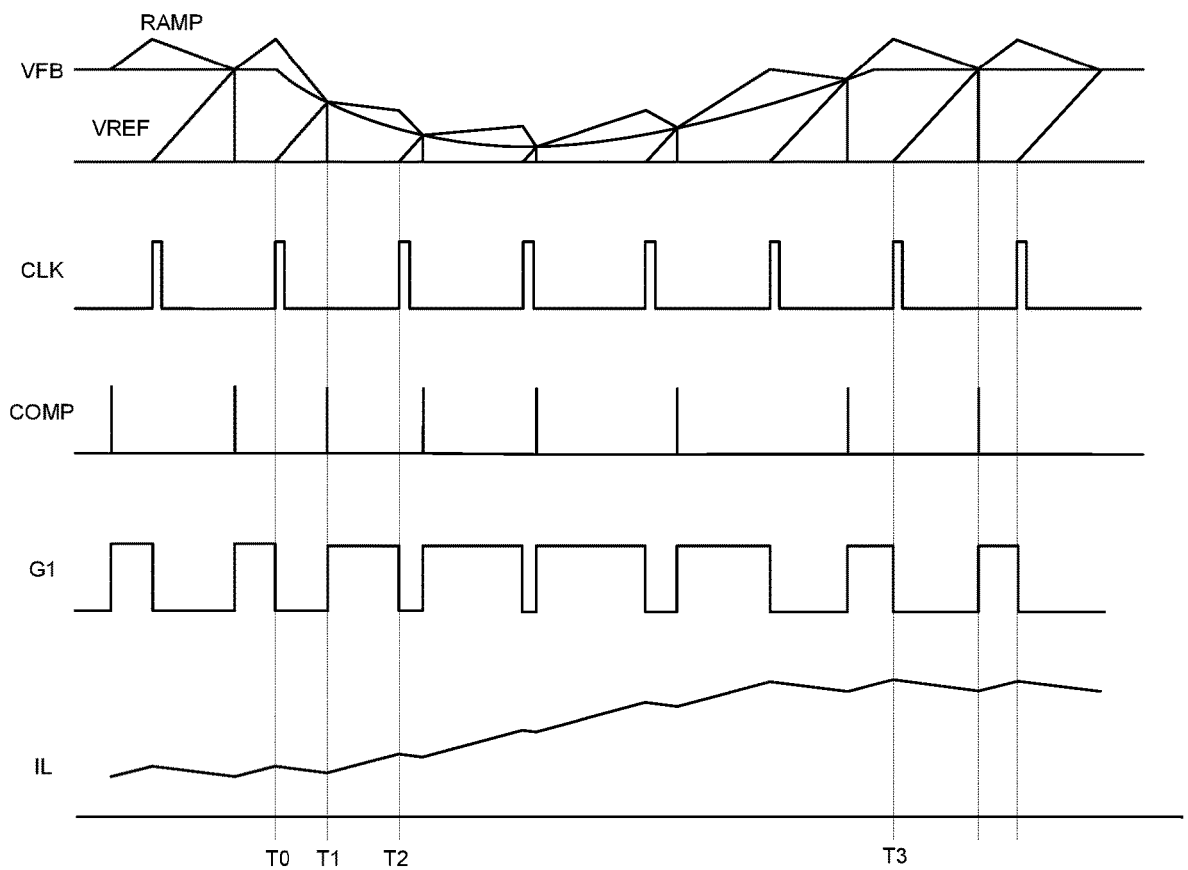
FIGS. 5A and 5B shows the waveforms of the signals illustrating transient response of the voltage converter 201 in accordance with an embodiment of the present invention.
Figure 5B:
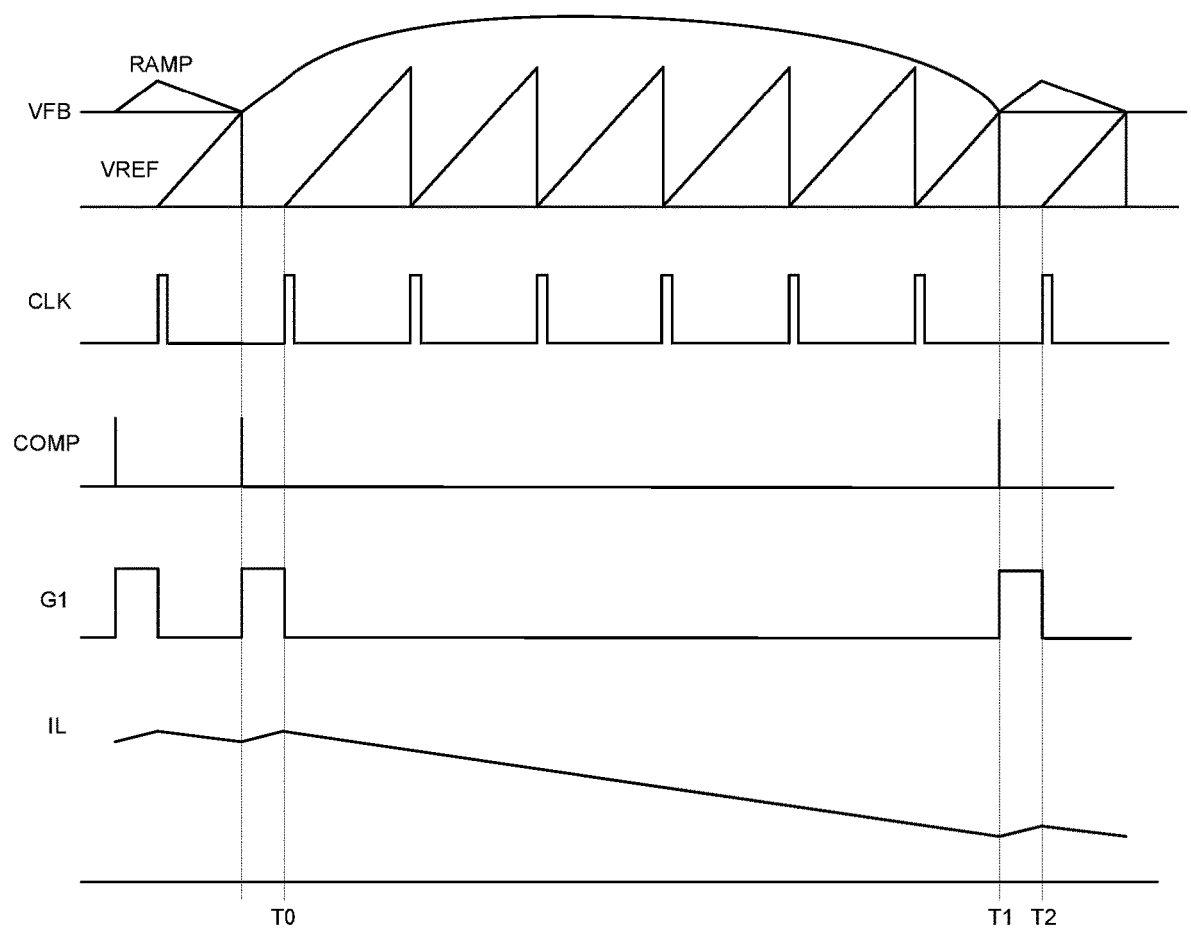

FIGS. 5A and 5B shows the waveforms of the signals illustrating transient response of the voltage converter 201 in accordance with an embodiment of the present invention. FIG. 5A shows the waveforms of the signals illustrating the transient response when the load steps up. At the time T0, the load steps up and the output voltage VOUT as well as the feedback voltage VFB begins to fall, at the same time the clock signal CLK happens to rises to high level, so the control signal G1 is reset and falls to low level, the high-side power switch M1 is turned off and the inductor current IL decreases. The ramp signal RAMP decreases while the reference voltage VREF increases. At the time T1, the reference voltage VREF reaches the sum of the feedback voltage VFB and the ramp signal RAMP, so the comparison signal COMP rises to high level, the control signal G1 rises to high level, the high-side power switch M1 is turned on and the inductor current IL increases. The ramp signal RAMP increases and the reference voltage VREF decreases. During the time when the high-side power switch M1 is turned on, the value of the reference voltage VREF is kept as the base voltage VBASE. At the time T2, the clock signal CLK pulses in the next clock cycle, so the aforementioned process is repeated. After several clock cycles, the output voltage VOUT and the feedback voltage VFB recover to the values under steady state. At the time T3, the transient process is over. As FIG. 5A shows, after the load suddenly steps up, the duty ratio of the control signal G1 grows larger and larger by cycle, and then gets back to normal, while the frequency of the control signal G1 is constant and the same with the frequency of the clock signal CLK.

FIG. 5B shows the waveforms of the signals illustrating the transient response when the load steps down. At the time T0, the load steps down, the output voltage VOUT as well as the feedback voltage VFB begins to rise, meanwhile the clock signal CLK happens to rise to high level, so the control signal G1 falls to low level, the high-side power switch M1 is turned off and the inductor current IL decreases. The ramp signal RAMP decreases while the reference voltage VREF increases. Since the reference voltage VREF is smaller than the sum of the feedback voltage VFB and the ramp signal RAMP, the comparison signal COMP and the control signal G1 stay at low level, and the inductor current IL keeps decreasing. Accordingly, as FIG. 5B shows, during the time when the reference voltage VREF is still smaller than the sum of the feedback voltage VFB and the ramp signal RAMP, for each clock cycle, the reference voltage VREF increases until the clock signal CLK pulses in the next clock cycle. After several clock cycles, the output voltage VOUT and the feedback voltage VFB recover to the values under steady state. At the time T1, the reference voltage VREF reaches the sum of the feedback voltage VFB and the ramp signal RAMP, so the comparison signal COMP rises to high level, the control signal G1 rises to high level, the high-side power switch M1 is turned on and the inductor current IL increases. At the time T2, the clock signal CLK pulses in the next clock cycle, the control signal G1 then falls to low level and the inductor current IL decreases. As FIG. 5B shows, after the load steps down, the high-side power switch M1 keeps turned off until the feedback voltage VFB falls back to the previous value under steady state.

Figure 6:
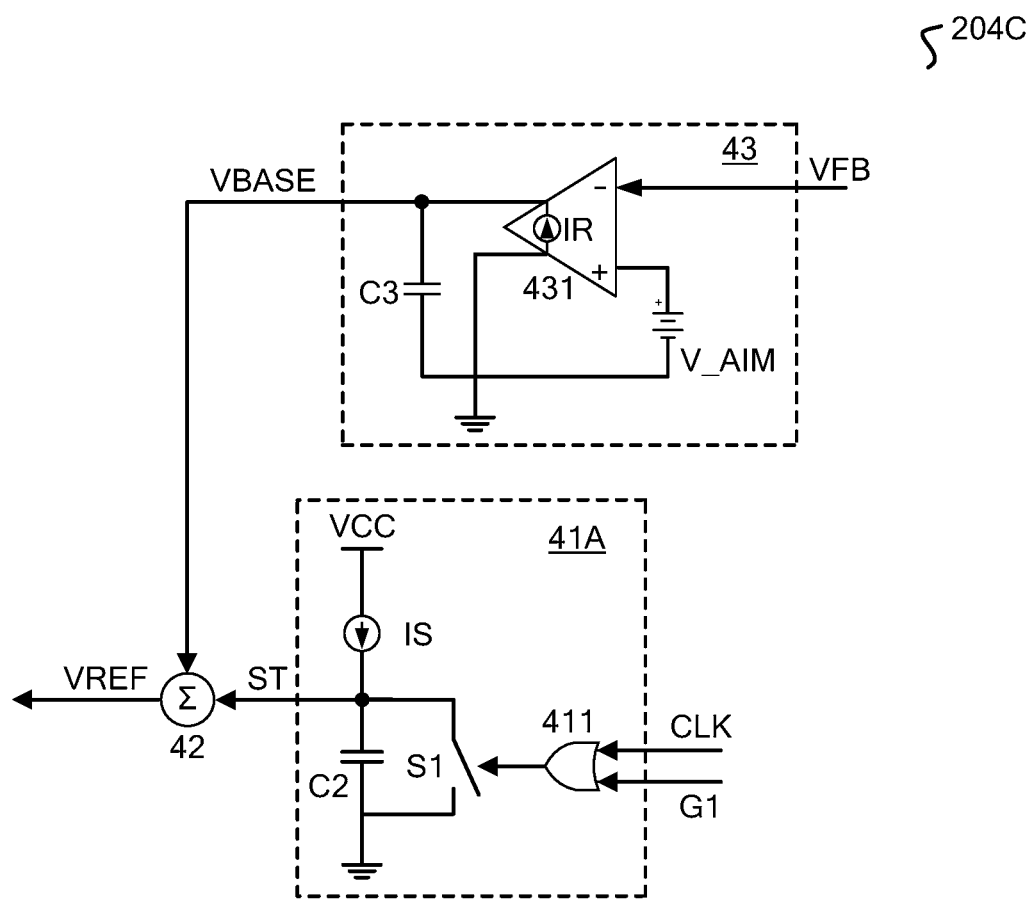
FIG. 6 schematically shows a reference generating circuit 204C in accordance with an embodiment of the present invention.

FIG. 6 schematically shows a reference generating circuit 204C in accordance with an embodiment of the present invention. In the example of FIG. 6, the base voltage VBASE is regulated based on the feedback voltage VFB and a source voltage V_AIM, so the reference voltage VREF is accordingly adjusted. Compared with the reference generating circuit 204A showed in FIG. 2, the reference generating circuit 204C further comprises a base voltage regulating circuit 43, comprising a trans-conductance amplifier 431, and a capacitor C3. The trans-conductance amplifier 431 has an inverting input terminal receiving the feedback voltage VFB, a non-inverting input terminal receiving the source voltage V_AIM, and an output terminal providing a regulating current IR in proportional to the differential between the source voltage V_AIM and the feedback voltage VFB. The source voltage V_AIM is constant. The capacitor C3 has a first terminal coupled to the output terminal of the trans-conductance 431 and a second terminal coupled to the ground reference. The regulating current IR flows into the capacitor C3 for charging, and the voltage across the capacitor C3 is the base voltage VBASE.

After the start of the voltage converter, since the capacitor C3 is charged by the regulating current IR, the voltage across the capacitor C3, namely the base voltage VBASE, is built gradually. Before the voltage converter enters the steady state, the building up of the base voltage VBASE follows the building up of the feedback voltage VFB in proportion to the output voltage VOUT, thus possible current and voltage peaks of the voltage converter are suppressed or avoided. As the feedback voltage VFB is approaching the value of the source voltage V_AIM, the regulating current IR in proportion to the differential between the source voltage VAIM and the feedback voltage VFB is approaching zero. When the feedback voltage VFB builds up to reaches the source voltage V_AIM, the base voltage VBASE stops increasing and keeps constant. Thus, the inaccuracy in the output voltage VOUT, reflected in the feedback voltage VFB, will be eliminated in the reference generating circuit 204C.

Figure 7:
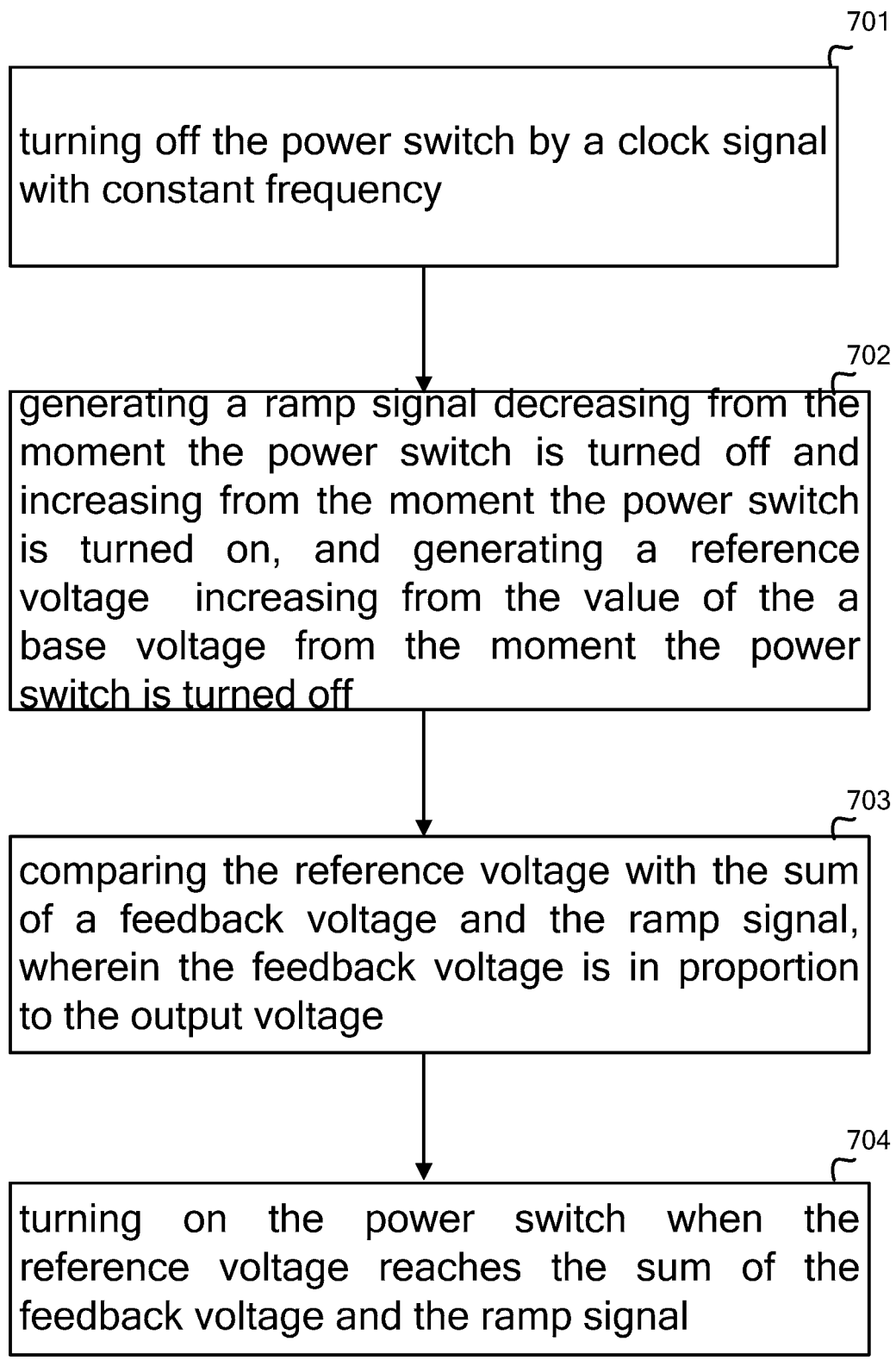
FIG. 7 shows a flow chart of a method of controlling a voltage converter in accordance with an embodiment of the present invention.

FIG. 7 shows a flow chart of a method of controlling a voltage converter in accordance with an embodiment of the present invention. The voltage converter comprises at least a power switch to convert an input voltage into an output voltage. The method may comprise the following steps.

In step 701, turning off the power switch by a clock signal with a constant frequency;

In step 702, generating a ramp signal decreasing from the moment the power switch is turned off and increasing from the moment the power switch is turned on, and generating a reference voltage increasing from the value of a base voltage from the moment the power switch is turned off.

In step 703, comparing the reference voltage with the sum of a feedback voltage and the ramp signal, wherein the feedback voltage is in proportion to the output voltage.

In step 704, turning on the power switch when the reference voltage reaches the sum of the feedback voltage and the ramp signal.

In some embodiments, the clock signal is generated internally. In other embodiments, the clock signal is synced with an external clock circuit. In one embodiment, the ramp signal decreases to zero at the moment when the power switch is turned on.

While specific embodiments of the present invention have been provided, it is to be understood that these embodiments are for illustration purposes and not limiting. Since the invention can be practiced in various forms without distracting the spirit or the substance of the invention, it should be understood that the above embodiments are not confined to any aforementioned specific detail, but should be explanatory broadly within the spirit and scope limited by the appended claims. Thus, all the variations and modification falling into the scope of the claims and their equivalents should be covered by the appended claims.

What is claimed is:

1. A control circuit for a voltage converter converting an input voltage into an output voltage, wherein the voltage converter has a power switch, the control circuit comprising:
    a ramp circuit, configured to generate a ramp signal, wherein the ramp signal decreases from a moment the power switch is turned off and increases from a moment the power switch is turned on;
    a reference generating circuit, configured to generate a reference voltage, wherein the reference voltage increases from a value of a base voltage when the power switch is turned off, wherein the base voltage is regulated based on a feedback voltage and a source voltage, and the source voltage has a constant voltage level;
    a comparison circuit, configured to provide a comparison signal in response to the reference voltage and a sum of the feedback voltage and the ramp signal; and
    a logic circuit, configured to generate a control signal to control the power switch based on the comparison signal and a clock signal with constant frequency, wherein the power switch is turned off by the clock signal, and is turned on when the comparison signal indicates that the reference voltage increases to the sum of the feedback voltage and the ramp signal.

2. The control circuit of claim 1, wherein the reference generating circuit comprises:
    a sawtooth circuit configured to generate a sawtooth signal, comprising:
        a current source, configured to provide a charge current;
        a capacitor, configured to receive the charge current and provide the sawtooth signal; and
        a control switch, coupled in parallel with the capacitor, wherein the control switch is controlled to be on and off by the clock signal; and
    an adding circuit, configured to provide the reference voltage as a sum of the sawtooth signal and the base voltage.

3. The control circuit of claim 1, wherein the reference generating circuit further comprises a base voltage regulating circuit, and wherein the base voltage regulating circuit comprises:
    a trans-conductance amplifier, having an inverting input terminal receiving the feedback voltage, a non-inverting input terminal receiving the source voltage, and an output terminal providing a regulating current; and
    a capacitor, having a first terminal coupled to the output terminal of the trans-conductance amplifier, and a second terminal coupled to a ground reference, wherein a voltage across the capacitor is provided as the base voltage.

4. The control circuit of claim 1, wherein the reference generating circuit comprises:
    a sawtooth circuit configured to generate a sawtooth signal, comprising:
        a current source, configured to provide a charge current;
        a capacitor, configured to receive the charge current;

a one-shot circuit, configured to provide a pulse signal based on the clock signal; and a control switch, coupled in paralleled with the capacitor, wherein the control switch is controlled to be on and off by the pulse signal provided by the one-shot circuit; and an adding circuit, configured to provide the reference voltage as a sum of the sawtooth signal and the base voltage.

5. The control circuit of claim 1, wherein the reference generating circuit comprises:

a sawtooth circuit configured to generate a sawtooth signal, comprising:

a current source, configured to provide a charge current;

a capacitor, configured to receive the charge current and to provide the sawtooth signal;

an OR gate, configured to receive the clock signal and the control signal, and to provide a signal based thereon;

a control switch, coupled in parallel with the capacitor, wherein the control switch is controlled to be on and off by the signal provided by the OR gate; and an adding circuit, configured to provide the reference voltage as a sum of the sawtooth signal and the base voltage.

6. The control circuit of claim 1, wherein the logic circuit comprises:

an RS latch, having a reset terminal receiving the clock signal, a set terminal receiving the comparison signal, and an output terminal providing the control signal.

7. A voltage converting system for converting an input voltage into an output voltage, comprising:

a voltage converter, comprising a power switch having a first terminal coupled to the input voltage, a second terminal and a controlled terminal; and a control circuit, comprising:

a ramp circuit, configured to generate a ramp signal, wherein the ramp signal decreases from a moment the power switch is turned off and increases from a moment the power switch is turned on;

a reference generating circuit, configured to generate a reference voltage, wherein the reference voltage increases from a value of a base voltage from a moment the power switch is turned off, wherein the base voltage is regulated based on a feedback voltage and a source voltage, and the source voltage has a constant voltage level;

a comparison circuit, configured to provide a comparison signal in response to the reference voltage and a sum of the feedback voltage and the ramp signal; and a logic circuit, configured to generate the control signal based on the comparison signal and a clock signal with constant frequency, wherein the power switch is turned off by the clock signal, and is turned on when the comparison signal indicates that the reference voltage increases to the sum of the feedback voltage and the ramp signal.

8. The voltage converting system of claim 7, wherein the reference generating circuit comprises:

a sawtooth circuit configured to generate a sawtooth signal, comprising:

a current source, configured to provide a charge current;

a capacitor, configured to receive the charge current and provide the sawtooth signal; and a control switch, coupled in parallel with the capacitor, wherein the control switch is controlled to be on and off by the clock signal; and an adding circuit, configured to provide the reference voltage as a sum of the sawtooth signal and the base voltage.

9. The voltage converting system of claim 7, wherein the reference generating circuit further comprises a base voltage regulating circuit, the base voltage regulating circuit comprising:

a trans-conductance amplifier, having an inverting input terminal receiving the feedback voltage, a non-inverting input terminal receiving the source voltage, and an output terminal providing a regulating current; and a capacitor, having a first terminal coupled to the output terminal of the trans-conductance amplifier, and a second terminal coupled to a ground reference, wherein a voltage across the capacitor is provided as the base voltage.

10. The voltage converting system of claim 7, wherein the comparison circuit comprises:

a comparator, having an inverting input terminal receiving the sum of the feedback voltage and the ramp signal, a non-inverting input terminal receiving the reference voltage, and an output terminal providing the comparison signal.

11. The voltage converting system of claim 7, wherein the logic circuit comprises:

an RS latch, having a reset input terminal receiving the clock signal, a set input terminal receiving the comparison signal, and an output terminal providing the control signal.

12. A method of controlling a voltage converter to convert an input voltage into an output voltage, wherein the voltage converter comprises at least a power switch, the method comprising:

turning off the power switch by a clock signal with constant frequency;

generating a ramp signal and a reference voltage, wherein the ramp signal decreases from a moment the power switch is turned off and increases from a moment the power switch is turned on, and the reference voltage increases from a value of a base voltage from a moment the power switch is turned off, wherein the base voltage is regulated based on a feedback voltage and a source voltage, and the source voltage has a constant voltage level;

comparing the reference voltage with a sum of the feedback voltage and the ramp signal, wherein the feedback voltage is in proportion to the output voltage; and turning on the power switch when the reference voltage reaches the sum of the feedback voltage and the ramp signal.

13. The method of claim 12, wherein the reference voltage decreases to the value of the base voltage when the power switch is turned on.

* * * * *